(12) United States Patent
Matsuo et al.

(10) Patent No.: US 6,717,251 B2
(45) Date of Patent: Apr. 6, 2004

(54) STACKED TYPE SEMICONDUCTOR DEVICE

(75) Inventors: Mie Matsuo, Kamakura (JP); Nobuo Hayasaka, Yokosuka (JP); Tsunetoshi Arikado, Tokyo (JP); Hidemi Ishiuchi, Yokohama (JP); Koji Sakui, Tokyo (JP); Chiaki Takubo, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 09/961,332

(22) Filed: Sep. 25, 2001

(65) Prior Publication Data
US 2002/0036338 A1 Mar. 28, 2002

(30) Foreign Application Priority Data

Sep. 28, 2000 (JP) ........................................ 2000-296822
Sep. 21, 2001 (JP) ........................................ 2001-288048

(51) Int. Cl.$^7$ .............................................. H01L 23/02
(52) U.S. Cl. ...................... 257/686; 257/685; 257/777; 257/723
(58) Field of Search ................................ 257/686, 685, 257/777, 723

(56) References Cited

U.S. PATENT DOCUMENTS

| | | | |
|---|---|---|---|
| 5,481,133 A | | 1/1996 | Hsu |
| 5,604,377 A | * | 2/1997 | Palagonia ................... 257/685 |
| 5,915,167 A | | 6/1999 | Leedy ........................ 438/108 |
| 5,973,392 A | | 10/1999 | Senba et al. |
| 6,087,719 A | | 7/2000 | Tsunashima |
| 6,133,640 A | | 10/2000 | Leedy ........................ 257/778 |
| 6,239,495 B1 | * | 5/2001 | Sakui et al. ................ 257/777 |

FOREIGN PATENT DOCUMENTS

| | | | |
|---|---|---|---|
| DE | 691 07 808 | 6/1992 | |
| EP | 0 075 945 | 4/1983 | |
| EP | 0 782 191 | 7/1997 | |
| JP | 60-194548 | * 10/1985 | ................ 257/686 |
| JP | 61-101067 | * 5/1986 | ................ 257/686 |
| JP | 05275611 | 10/1993 | |
| JP | 8-236694 | 9/1996 | |
| JP | 08264712 | 10/1996 | |
| JP | 10-223833 | 8/1998 | |
| JP | 2000-68445 | * 8/1998 | ......... H01L/25/065 |
| JP | 11-168157 | 2/1999 | |
| JP | 11317494 | 11/1999 | |

OTHER PUBLICATIONS

Translation of the Official Action of the German Patent and Trademark Office, Nov. 21, 2002, 4 pages.
U.S. patent application Ser. No. 09/377,486, filed Aug. 20, 1999, to Hayasaka et al.
Korean Patent Office Action dated October 30, 2003, and English translation thereof.

* cited by examiner

*Primary Examiner*—Jasmine Clark
(74) *Attorney, Agent, or Firm*—Finnegan, Henderson, Farabow, Garrett & Dunner, L.L.P.

(57) ABSTRACT

Provided is a stacked type semiconductor device formed of a plurality of semiconductor integrated circuit devices stacked, each having a specification and including a semiconductor integrated circuit chip, wherein at least three of the semiconductor integrated circuit devices are stacked in the order of a value of the specification.

26 Claims, 7 Drawing Sheets

STACKED TYPE SEMICONDUCTOR DEVICE

CROSS-REFERENCE TO RELATED APPLICATIONS

This application is based upon and claims the benefit of priority from the prior Japanese Patent Applications No. 2000-296822, filed Sep. 28, 2000; and No. 2001-288048, filed Sep. 21, 2001, the entire contents of both of which are incorporated herein by reference.

BACKGROUND OF THE INVENTION

1. Field of the Invention

The present invention relates to a stacked type semiconductor device having a plurality of semiconductor integrated circuit devices stacked.

2. Description of the Related Art

With miniaturization and weight reduction of an electronic device such as a portable device or a mobile device, miniaturization and high integration are required for electronic parts configuring an electronic device as well. Because of this, there has been a growing demand for a stacked type semiconductor device (a multiple chip device) having semiconductor integrated circuit chips (LSI chips) in a three-dimensional manner.

However, an effective stacking method of semiconductor integrated circuit chips is not proposed.

BRIEF SUMMARY OF THE INVENTION

According to a first aspect of the present invention, there is provided a stacked type semiconductor device formed of a plurality of semiconductor integrated circuit devices stacked, each having a specification and including a semiconductor integrated circuit chip, wherein at least three of the semiconductor integrated circuit devices are stacked in the order of a value of the specification.

According to a second aspect of the present invention, there is provided a stacked type semiconductor device formed of at least three semiconductor integrated circuit devices stacked, each having a specification and including a semiconductor integrated circuit chip, wherein a value of the specification of the uppermost semiconductor integrated circuit device or the lowermost semiconductor integrated circuit device is maximum or minimum.

According to a third aspect of the present invention, there is provided a stacked type semiconductor device formed of at least two semiconductor integrated circuit devices stacked, each having a specification and including a semiconductor integrated circuit chip, wherein each of the semiconductor integrated circuit devices includes a conductor that penetrates the semiconductor integrated circuit device, and the semiconductor integrated circuit devices are electrically connected by the conductors and a value of the specification, excluding a size, of the uppermost semiconductor integrated circuit device or the lowermost semiconductor integrated circuit device is maximum or minimum.

According to a fourth aspect of the present invention, there is provided a stacked type semiconductor device formed of a plurality of semiconductor integrated circuit devices stacked, each having a specification and including a semiconductor integrated circuit chip, wherein at least two, but not all, of the semiconductor integrated circuit devices form a group, have values of the specification which fall within a predetermined range and are sequentially stacked.

According to a fifth aspect of the present invention, there is provided a stacked type semiconductor device formed of a plurality of semiconductor integrated circuit devices stacked, each including a semiconductor integrated circuit chip, wherein two of the semiconductor integrated circuit devices, between which a largest amount of signals is transmitted, are sequentially stacked.

According to a sixth aspect of the present invention, there is provided a stacked type semiconductor device comprises a first semiconductor integrated circuit device including a semiconductor integrated circuit chip; a second semiconductor integrated circuit device including a semiconductor integrated circuit chip and spaced apart from the first semiconductor integrated circuit device in a first direction; and a plurality of semiconductor integrated circuit devices arranged in a plane perpendicular to the first direction and sandwiched by the first and second semiconductor integrated circuit devices, each of the semiconductor integrated circuit devices including a semiconductor integrated circuit chip.

DETAILED DESCRIPTION OF THE INVENTION

Hereinafter, embodiments of the present invention will be described with reference to the accompanying drawings.

Figure 1A:
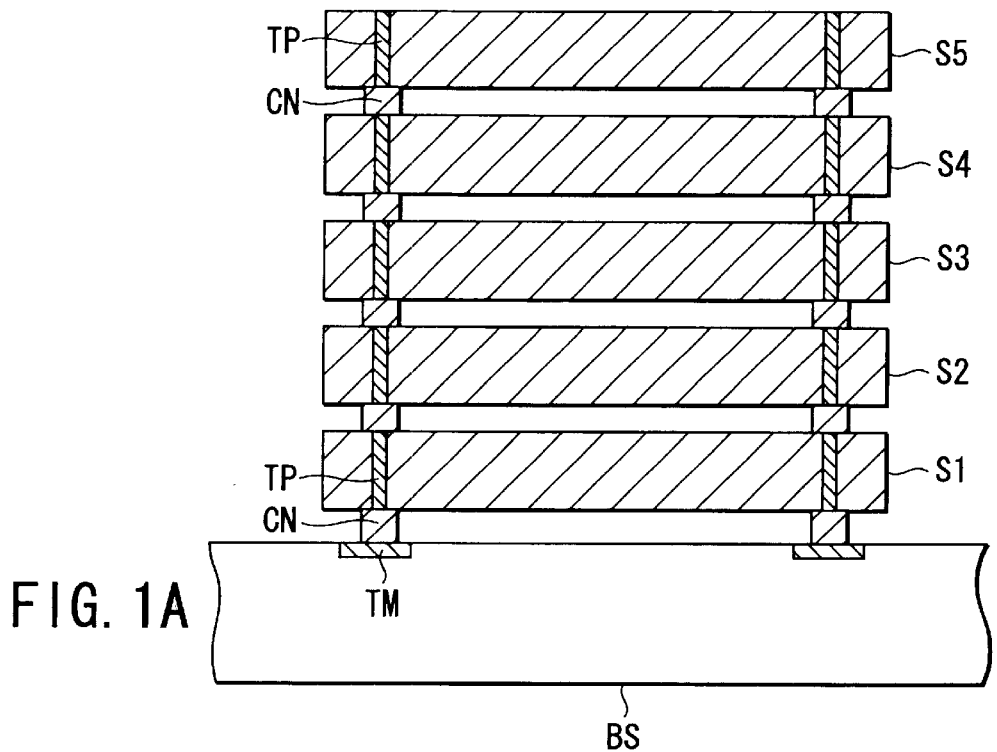
FIG. 1A is a view schematically showing a sectional configuration of an example of a stacked type semiconductor device according to one embodiment of the present invention.

FIG. 1A shows a first exemplary configuration of a stacked type semiconductor device according to one embodiment of the present invention.

A plurality of semiconductor integrated circuit chips (LSI chips) S1 to S5 are stacked on a base substrate BS. The base substrate BS functions as a motherboard, and a terminal TM and a wiring pattern, a power source and the like (not shown) are provided.

A through plug TP made of an electrically conductive material that penetrates semiconductor integrated circuit chip is provided in each semiconductor integrated circuit chip S1 to S5. A connection between the terminal TM of the base substrate BS and the through plug TP in the bottom layer and a connection between the adjacent through plugs TP are made by an electrically conductive connection member CN. A BGA (Ball Grid Array), for example, is used for the electrically conductive connection member CN. A signal is transmitted/received between the base substrate and the semiconductor integrated circuit chip and between the semiconductor integrated chips via the through plug TP and the electrically conductive connection member CN.

Figure 1B:
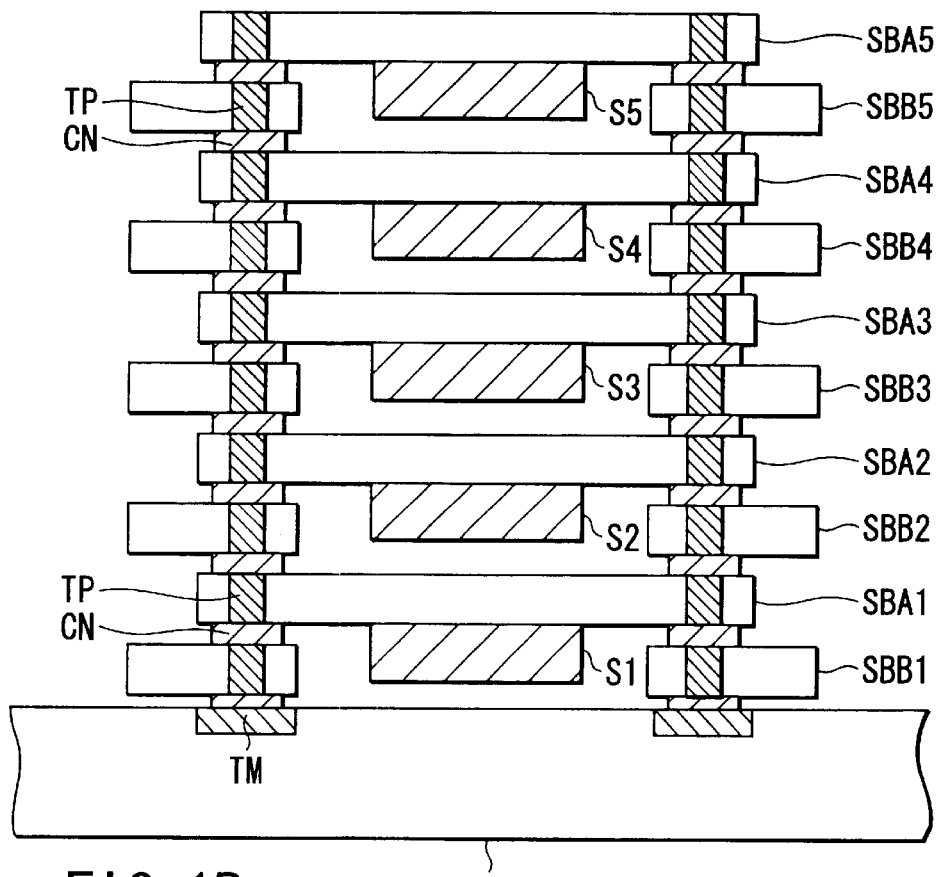
FIG. 1B is a view schematically showing a sectional configuration of another example of the stacked type semiconductor device according to one embodiment of the present invention.

FIG. 1B shows a second exemplary configuration of the stacked type semiconductor device according to one embodiment of the present invention.

A plurality of semiconductor integrated circuit chips S1 to S5 are stacked on the base substrate BS. The base substrate BS functions as a motherboard, and the terminal TM and a wiring pattern, a power source and the like (not shown) are provided.

The semiconductor integrated circuit chips S1 to S5 are mounted on substrates SBA1 to SBA5. A wiring (not shown) for electrically connecting a terminal of the semiconductor integrated circuit chip and a through plug TP described later is provided on each substrate SBA1 to SBA5. Substrates SBB1 to SBB5 are interposed between the base substrate BS and the substrate SBAL in the bottom layer and between the adjacent substrates SBA1 to SBA5. A hole is formed at the center of each substrate SBB1 to SBB5. Each semiconductor integrated circuit chip S1 to S5 is disposed corresponding to the hole.

A through plug TP made of an electrically conductive material that penetrates the substrate is provided in each substrate SBA1 to SBA5 and each substrate SBB1 to SBB5. A connection between the terminal TM of the base substrate BS and the through plug TP in the bottom layer and a connection between the adjacent through plugs TP are made by an electrically conductive connection member CN. A solder is used for the electrically conductive connection member CN, for example. A signal is transmitted/received between the base substrate and the semiconductor integrated circuit chip and between the semiconductor integrated circuit chips via the electrically conductive connection member CN and a wiring (not shown) provided on the substrate SBA1 to SBA5.

For example, as shown in FIG. 1A, in the case where the semiconductor integrated circuit chips (S1 to S5) are directly connected to each other by a through plug, the semiconductor integrated circuit chip itself corresponds to a semiconductor integrated circuit device.

In addition, for example, as shown in FIG. 1B, in the case where the substrates (SBA1 to SBA5) having the semiconductor integrated circuit chips (S1 to S5) mounted thereon are connected by the through plug, a substrate with chip comprising the semiconductor integrated circuit chip (for example, S1) and the substrate (for example, SBAL) corresponds to a semiconductor integrated circuit device. In such a substrate with chip, the specification of the semiconductor integrated circuit device may be the specification of the semiconductor integrated chip itself or may be the specification of the substrates with chip.

In short, the semiconductor integrated circuit device may be the semiconductor integrated circuit chip or may be a device that includes the semiconductor integrated circuit chip and other elements (such as substrate). The specification of the semiconductor integrated circuit device may be the specification of the semiconductor integrated circuit chip (case 1) or may be the specification of the device that includes the semiconductor integrated circuit chip and other elements (such as substrate)(case 2).

Although the following description assumes a case 1 for clarity, this applies to a case 2 as well.

Hereinafter, stacking method of the stacked type semiconductor device according to the present embodiment will be described with respect to its basic types.

(Type 1)

This type is such that at least three predetermined semiconductor integrated circuit chips are stacked in the order of a value of the specification.

Figure 2A:
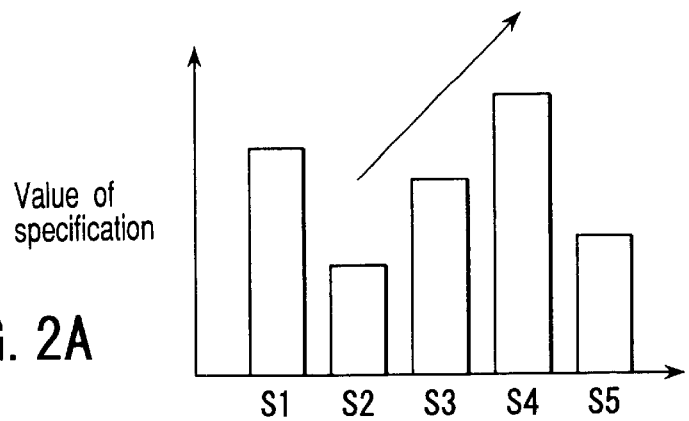
FIG. 2A and FIG. 2B are views each schematically showing an example of type 1 of the stacked type semiconductor device according to one embodiment of the present invention.
Figure 2B:
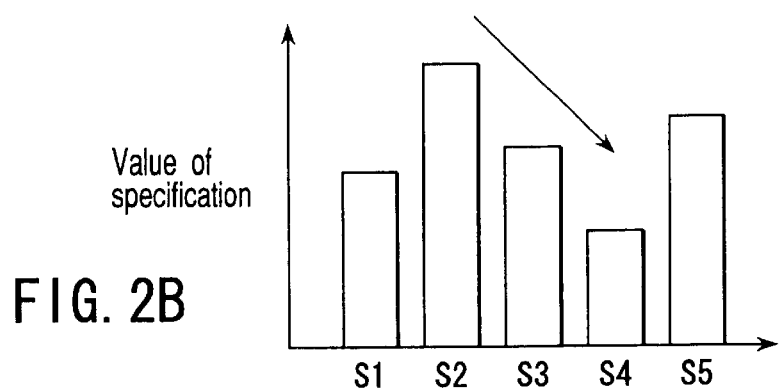

FIG. 2A and FIG. 2B each schematically show an example of this type. A horizontal axis indicates a stack order of semiconductor integrated circuit chips S1 to S5, and a vertical axis indicates the value (such as power consumption) of the specification of each of the semiconductor integrated circuit chips S1 to S5.

In examples shown in FIG. 2A and FIG. 2B, although the values of the specification increase or decrease in a stack range of the chips S2 to S4, the values of the specification, of course, may increase or decrease in a stack range of four layers or more.

Figure 3A:
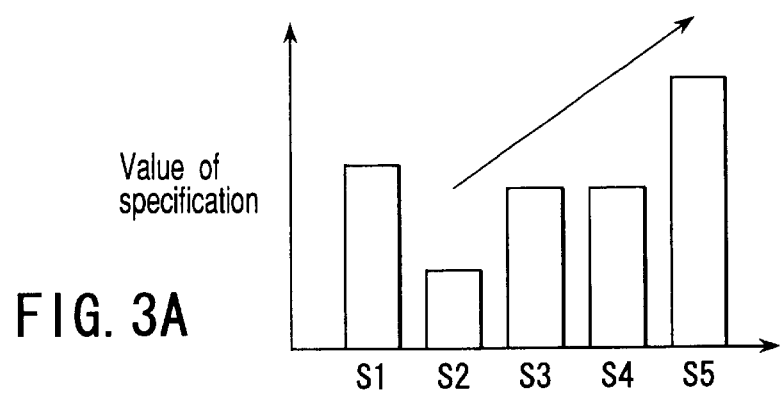
FIG. 3A and FIG. 3B are views each schematically showing another example of type 1 of the stacked type semiconductor device according to one embodiment of the present invention.
Figure 3B:
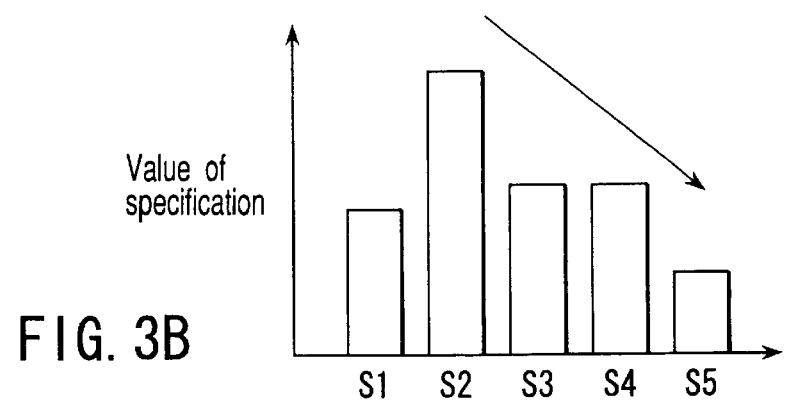

FIG. 3A and FIG. 3B each schematically show another example of this type. In this way, two or more chips (S3 and S4 in the shown examples) whose specification values are identical may be adjacent to each other. That is, even when there exist a plurality of chips whose specification values are identical, the values may increase or decrease in at least two steps.

Figure 4A:
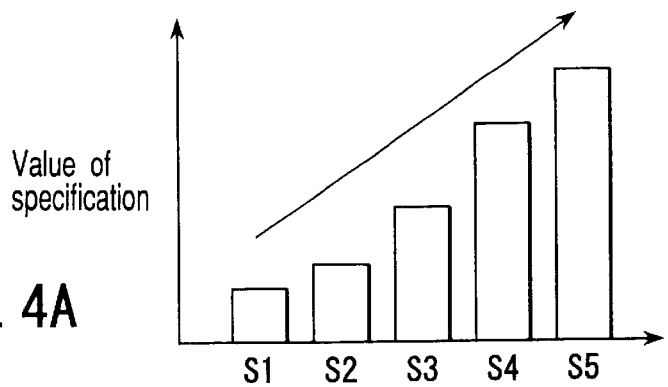
FIG. 4A and FIG. 4B are views each schematically showing another example of type 1 of the stacked type semiconductor device according to one embodiment of the present invention.
Figure 4B:
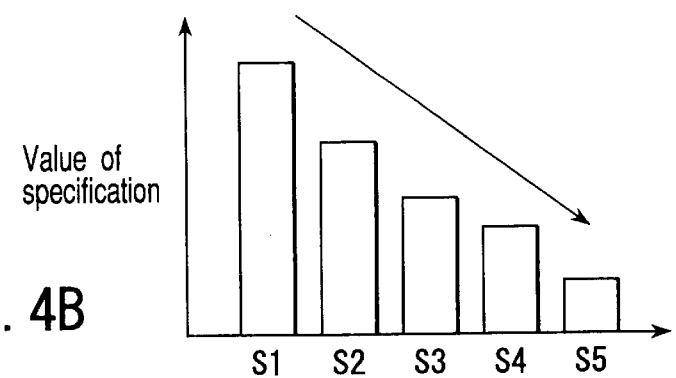

FIG. 4A and FIG. 4B each schematically show another example of this type. In this example, at least one of the chip S1 in the bottom layer and the chip S5 in the top layer is included in the at least three predetermined chips. In the shown example, both of the chips S1 and S5 are included in the at least three predetermined chips, and the values of the specification increase or decrease over the full stack range. As shown in FIG. 3A and FIG. 3B, the chips whose specification values are identical to each other may be adjacent to each other.

Figure 5A:
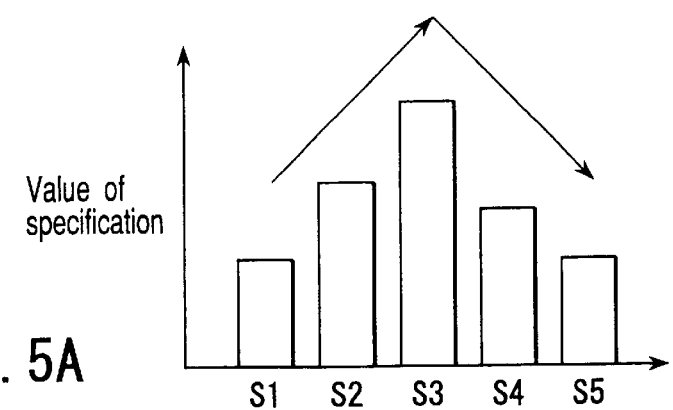
FIG. 5A and FIG. 5B are views each schematically showing another example of type 1 of the stacked type semiconductor device according to one embodiment of the present invention.
Figure 5B:
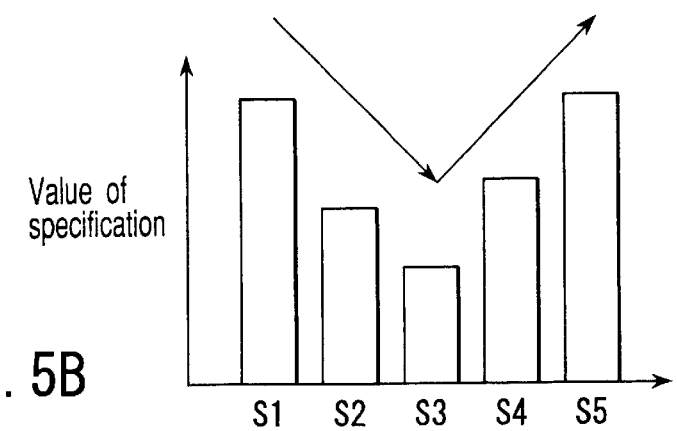

FIG. 5A and FIG. 5B each schematically show another example of this type. In this example, at least one of the chip S1 in the bottom layer and the chip S5 in the top layer is not included in the at least three predetermined chips. In the shown example, the chip S3 whose specification value is maximum or minimum is a chip other than the chip 1 in the bottom layer and the chip 5 in the top layer. As shown in FIG. 3A and FIG. 3B, the chips whose specification values are identical to each other may be adjacent to each other.

Figure 6A:
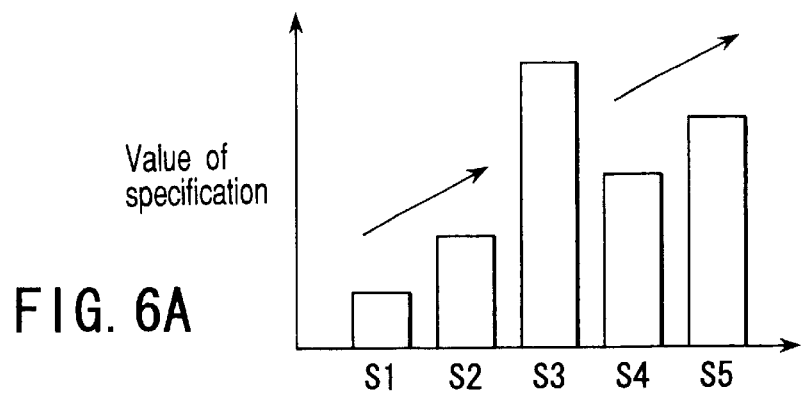
FIG. 6A and FIG. 6B are views each schematically showing another example of type 1 of the stacked type semiconductor device according to one embodiment of the present invention.
Figure 6B:
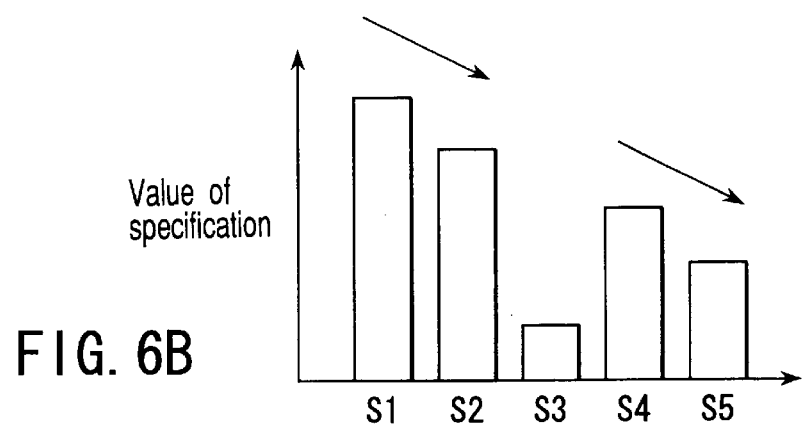

FIG. 6A and FIG. 6B each schematically show another example of this type. In this example, a specific chip is sandwiched between the predetermined chips. In the shown examples, the specific chip S3 is larger or smaller in values of the specification than the adjacent chips S2 and S4 at both sides of the chip S3. The values of the specification increase or decrease with respect to chips S1, S2, S4, and S5 other than the specific chip S3.

(Type 2)

In this type, the value of the specification of the uppermost or the lowermost semiconductor integrated circuit chip of the semiconductor integrated circuit chips in the full stack range are minimum or maximum. A total number of stacks of the semiconductor integrated circuit chips is 2 or more, or alternatively, 3 or more.

Figure 7A:
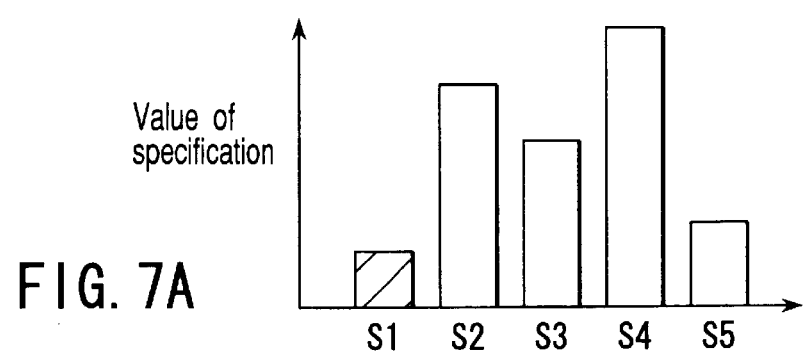
FIG. 7A and FIG. 7B are views each schematically showing an example of type 2 of the stacked type semiconductor device according to one embodiment of the present invention.
Figure 7B:
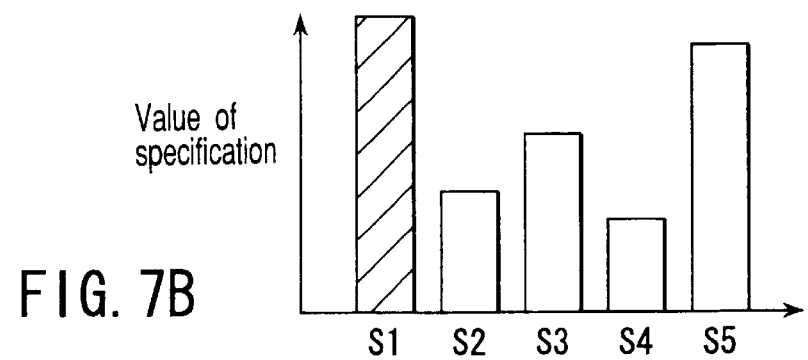

FIG. 7A and FIG. 7B each schematically shows an example of this type. In the shown examples, although the value of the specification of the chip S1 in the bottom layer are minimum or maximum, of course, the value of the specification of the chip S5 in the top layer may be minimum or maximum.

When the value of the specification of the chip 1 in the bottom layer is minimum (or maximum), a chip whose value is the second smallest (or largest) may be defined as the chip S5 in the top layer. Conversely, when the value of the specification of the chip S5 in the top layer is minimum (maximum), a chip whose specification value is the second smallest (or largest) may be defined as the chip S1 in the bottom layer. In addition, when there exist a plurality of chips whose specification values are minimum or maximum, these chips may be disposed in the bottom layer and the top layer. FIG. 5A and FIG. 5B each shows an example of this case and is included in type 2.

(Type 3)

This type is such that chips whose specification values are within a predetermined range form a group, and at least two semiconductor integrated circuit chips included in the group are sequentially stacked.

Figure 8:
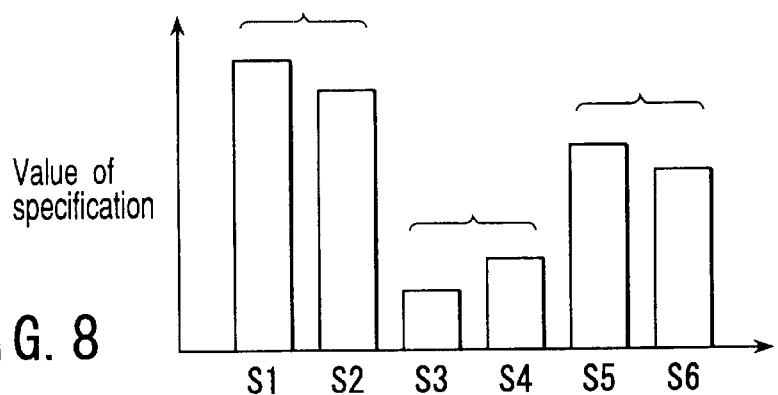
FIG. 8 is a view schematically showing an example of type 3 of the stacked type semiconductor device according to one embodiment of the present invention.

FIG. 8 schematically shows an example of this type. In the example shown in FIG. 8, chips S1 and S2, chips S3 and S4, and chips S5 and S6 respectively forms one group. In the example shown in FIG. 8, although two chips are included in one group, three or more chips may be included. In addition a different number of chips may be included in each group. Further, a chip which is not included in any group may exist.

(Type 4)

This type is such that one or more specific semiconductor circuit chips of a plurality of semiconductor integrated circuit chips are disposed at a predetermined stack position.

Figure 9:
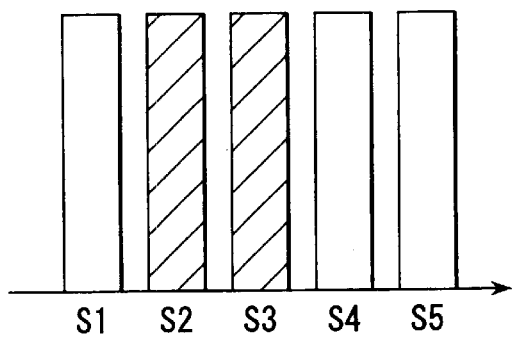
FIG. 9 is a view schematically showing an example of type 4 of the stacked type semiconductor device according to one embodiment of the present invention.

FIG. 9 schematically shows an example of this type. In this example, specific semiconductor integrated circuit chips (S2 and S3 in the example shown in FIG. 9) of a plurality of chips are sequentially stacked each other. Typically, specific two chips, between which a largest amount of signals is transmitted to and from, of all the chips are sequentially stacked each other. In addition, chips whose specification values are the closest may be sequentially stacked each other (this case is included in a concept for grouping of type 3).

Figure 10:
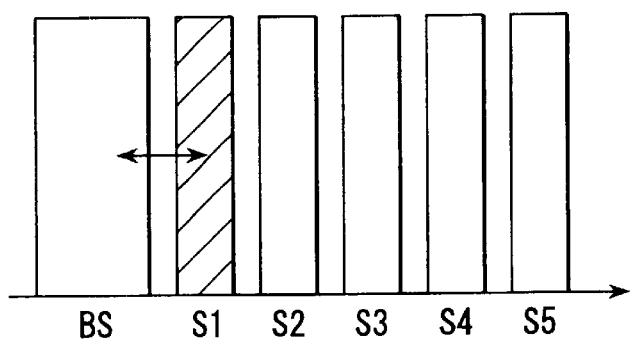
FIG. 10 is a view schematically showing another example of type 4 of the stacked type semiconductor device according to one embodiment of the present invention.

FIG. 10 schematically shows another example of this type. In the shown example, the chip S1 with the largest amount of signal transmission/reception relevant to the base substrate BS of all the chips is disposed at the closest position to the base substrate BS. The concept shown in FIG. 10 is included in that of type 2.

Figure 11:
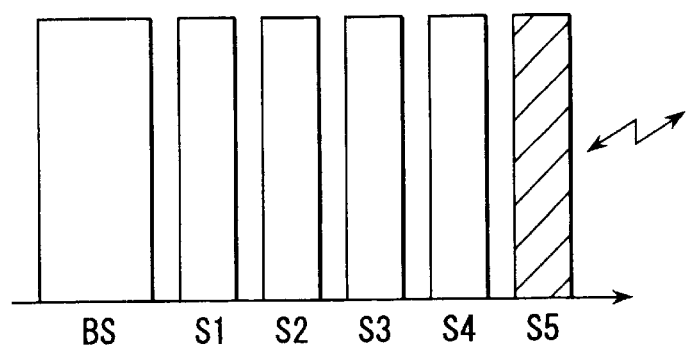
FIG. 11 is a view schematically showing another example of type 4 of the stacked type semiconductor device according to one embodiment of the present invention.

FIG. 11 schematically shows another example of this type. In the shown example, the chip S5 with the largest amount of signal transmission/reception relevant to an external environment of all the chips is disposed at the most distant position to the base substrate BS. The concept shown in FIG. 11 is included in that of type 2.

In each of the above described types, the specification of the semiconductor integrated circuit chips includes power consumption, operating voltage, number of operating voltages, operating current, guaranteed operating temperature, amount of generated electromagnetic waves, operating frequency, size, number of connection terminals, connection terminal pitch, thickness, amount of signals transmitted to and from a base substrate on which the semiconductor integrated circuit devices are to be mounted, and amount of signals transmitted to and from an external environment.

As described above, a stacked type semiconductor device having superior performance can be provided by optimizing a stacking method of semiconductor integrated circuit chips.

In addition, the above described stacking method is effective to a stacked type semiconductor device that makes electrical connection between the adjacent chips by using a through plug as shown in FIG. 1A or FIG. 1B. For example, when making electrical connection between chips by wire bonding, there applies a restriction based on a chip size that a small chip must be disposed on a large chip, for example, from the viewpoint of easiness of wire bonding. Therefore, it is considered that a degree of freedom is few in method of stacking chips. When making electrical connection between chips by a through plug, there does not apply the above described restriction, and a structure shown in FIG. 1C, for example, can be applied, thus making it possible to apply various stacking methods as described previously based on specifications except a chip size.

Figure 1C:
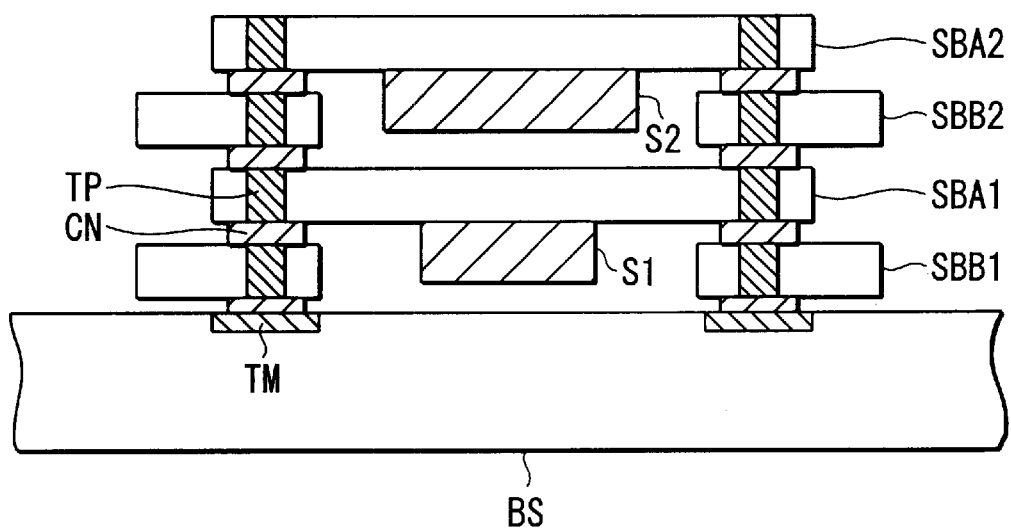
FIG. 1C is a view schematically showing a sectional configuration of still another example of the stacked type semiconductor device according to one embodiment of the present invention.

Especially, in a stacking method shown in FIG. 1C, there is provided a stacked type semiconductor device formed of at least two semiconductor integrated circuit devices stacked, each including a semiconductor integrated circuit chip, wherein each of the semiconductor integrated circuit devices includes a conductor that penetrates the semiconductor integrated circuit device, and the semiconductor integrated circuit devices are electrically connected by the conductors, and a semiconductor integrated circuit device with a large size is stacked above a semiconductor integrated circuit device with a small size.

Hereinafter, a specific method of stacking semiconductor integrated circuit chips relevant to the values of each specification will be described. The stacking methods described in the following examples are provided as one example. Basically, it is possible to employ various stacking methods as described in each of the above types.

EXAMPLE 1

In this example, the semiconductor integrated circuit chips S1 to S5 are stacked based on power consumption (for example, maximum power consumption) of the chips.

When stacking a plurality of chips having mutually different functions incorporated therein, it is required to carry out heat radiation (cooling) of the entire module in consideration of the power consumption of each chip, or in other words, in consideration of a flow of the heat generated at each chip. Because of this, chips are stacked as in the following example 1A or example 1B.

EXAMPLE 1A

In this example, chips are stacked in order from the chip with more power consumption, or a large amount of heat generation relevant to heat diffusion/transmission direction. For example, as in FIG. 4B, chips are stacked.

In this way, a chip with more power consumption is disposed at the base substrate BS side, or at a heat sink side, whereby the heat of the chip with much power consumption can be released quickly and efficiently to the heat sink. That is, the temperature of the chip with much power consumption can be reduced quickly. Therefore, the heat of the chip with less power consumption as well can be released efficiently to the heat sink, and heat radiation (cooling) of the entire module can be carried out efficiently.

When heat sinks are disposed at both sides of stacked chips (chip S1 side and chip S5 side), for example, chips may be stacked as in FIG. 5B. Otherwise, in this example, chips can be stacked as in FIG. 2B, FIG. 3B, FIG. 6B, and FIG. 7B, for example.

EXAMPLE 1B

In this example, chips are stacked in order from the chip with less power consumption, or with a small amount of heat radiation relevant to heat diffusion/transmission direction. For example, as in FIG. 4A, chips are stacked.

When a chip with more power consumption exists at the base substrate BS side, or at a heat sink side, such a chip with more power consumption may act as a barrier for heat diffusion. Because of this, heat diffusion from the chip with less power consumption to the heat sink may be prevented.

In this example, a chip with less power consumption is disposed on the base substrate BS, and thus, a chip with more power consumption does not act as a heat diffusion barrier. Therefore, heat diffusion from a chip with more power consumption to a chip with less power consumption, and further, to a heat sink can be carried out efficiently due to a temperature gradient, and heat radiation (cooling) of the entire module can be carried out efficiently.

When the heat sinks are disposed at both sides of stacked chips (chip S1 side and chip S5 side), for example, chips may be stacked as in FIG. 5A. Otherwise, in this example, chips can be stacked as in FIG. 2A, FIG. 3A, FIG. 6A, and FIG. 7A, for example.

EXAMPLE 2

In this example, chips are stacked based on an operating voltage (power source voltage) or the number of operating voltages (number of power source voltages) of the semiconductor integrated circuit chips S1 to S5.

When a plurality of chips are stacked, and is configured as a module, the operating voltage and the of operating voltages may differ depending on each chip. In such a case, it is required to stack chips in consideration of a voltage drop, connection to the power source and the like. Because of this, chips are stacked as shown in the following examples 2A to 2D.

EXAMPLE 2A

In this example, chips are stacked in order from the chip with highest operating voltage (power source voltage). For example, chips are stacked as in FIG. 4B. When a plurality of operating voltages exist in one chip, the operating voltages of chips are compared by defining the maximum operating voltage as a reference.

When a voltage is supplied from a base substrate, i.e., from a power source substrate to each chip, such a voltage is supplied to a chip distant from the power source via an intermediate chip. In general, a chip with a low operating voltage is low in allowable operating voltage. Because of this, when the operating voltage of the intermediate chip that is a voltage supply path is low, it leads to lowered reliability such as malfunction or destruction.

In this example, a chip with a high operating voltage is disposed at the base substrate BS side. Because of this, a voltage higher than an operating voltage of an intermediate chip that is a voltage supply path is not supplied from a power source of the base substrate to the intermediate chip. Therefore, lowered reliability such as malfunction or destruction can be prevented.

When the power source substrate is disposed at both sides of stacked chips (chip S1 side and chip S5 side), chips may be disposed as in FIG. 5B, for example. Otherwise, in this example, it is possible to stack chips as in FIG. 2B, FIG. 3B, FIG. 6B, and FIG. 7B, for example.

EXAMPLE 2B

In this example, chips are stacked in order from the chip with lowest operating voltage (power source voltage). Chips may be stacked as in FIG. 4A, for example. When a plurality of operating voltages exist in one chip, the operating voltages of chips are compared by defining the maximum operating voltage as a reference, for example.

When a voltage is supplied from a base substrate, i.e., from a power source substrate, to each chip, a chip distant from the power source is longer in voltage supply path as compared with a chip close to the power source. Thus, a voltage drop is likely to occur. An effect caused by the voltage drop increases with a chip with lower operating voltage. In this example, a chip with a low operating voltage is disposed at the base substrate BS side. Because of this, in view of the entire module, an effect caused by a voltage drop can be reduced, and improved reliability or the like can be ensured.

When a power source substrate is disposed at both sides of stacked chips (chip S1 side and chip S5 side), chips may be stacked as in FIG. 5A, for example. Otherwise, in this example, it is possible to stack chips as in FIG. 2A, FIG. 3A, FIG. 6A, and FIG. 7A, for example.

EXAMPLE 2C

When the number of operating voltages (the number of power source voltages) is different depending on each chip, for example, in the case of stacking a chip having one operating voltage and a chip having two operating voltages, a chip with more operating voltages is disposed at the base substrate BS side, that is, on the power source substrate side. Chips are stacked as in FIG. 4B, for example.

In this way, a chip with more operating voltages is disposed at the base substrate BS side, i.e., at the power source substrate side, whereby the number of through plugs for supplying a power source voltage from the base substrate BS to each chip can be reduced. Thus, a process cost can be reduced, and reliability is improved.

In the case power substrates are disposed at both sides of chips (chip S1 side and chip S5 side), chips may be disposed as in FIG. 5B, for example. Otherwise, in this example, it is possible to stack chips as in FIG. 2B, FIG. 3B, FIG. 6B, and FIG. 7B, for example.

EXAMPLE 2D

In this example, when a module is configured by only a chip with a single operation voltage, a plurality of chips close to or identical to each other in number of operating voltages are grouped, and the chips in the group are sequentially stacked. For example, chips are stacked as in FIG. 8, for example.

For example, chips whose operating voltages are identical to each other configure a group, whereby power terminals can be used in common, and the number of through plugs for supplying a power source voltage from the base substrate BS to each chip can be reduced. Therefore, a process cost is reduced, and a reliability can be improved.

EXAMPLE 3

In this example, chips are stacked based on an operating current of the semiconductor integrated circuit chips S1 to S5.

When the operating currents of chips are different from each other, it is required to stack chips in consideration of the operating current of each chip. Because of this, chips are stacked as follows.

In this example, when the operating currents of chips are different from each other, chips are stacked order from the largest operating current (for example, the maximum operating current). Chips are stacked as in FIG. 4B, for example.

When a current is supplied from the base substrate, i.e., from the power source substrate to each chip, a chip distant from the power source substrate is longer in current supply path as compared with a chip close to the power source substrate. Because of this, a resistance component in the current supply path is increased at the chip distant from the power source substrate. When a chip with more operating current is disposed at a position distant from the power source, a voltage loss increases from a relationship of voltage=current×resistance. In this example, the chip with more operating current is disposed at the base substrate BS side, i.e., at the power source substrate side. That is, the chip with more operating current is disposed at such a position that the resistance component of the current path is reduced, thus making it possible to reduce a voltage loss to the minimum.

When a power source substrate is disposed at both sides of chips (chip S1 side and chip S5 side), chips may be stacked as in FIG. 5B, for example. Otherwise, in this example, it is possible to stack chips as in FIG. 2B, FIG. 3B, FIG. 6B, and FIG. 7B, for example.

EXAMPLE 4

In this example, chips are stacked based on the guaranteed operating temperature of the semiconductor integrated circuit chips S1 to S5.

When a plurality of chips are stacked, and is configured as a module, it is required to ensure reliability of the entire module in consideration of the guaranteed operation temperature (standard for reliability) of each chip. Because of this, chips are stacked as follows.

In this example, when the guaranteed operating temperatures among chips are different from each other, chips close to or identical to each other in guaranteed operating temperature are grouped, and the chips in the group are sequentially stacked, thereby ensure a standard for reliability. For example, this method corresponds to the concept of FIG. 8. A chip with the lowest guaranteed operating temperature may be disposed at a stack position at which the lowest temperature is produced (at a stack position thermally designed so that the lowest temperature is produced). Further, the guaranteed operating temperature of the entire module may conform to a standard for the chip with the lowest guaranteed operating temperature.

In this way, chips are stacked in consideration of the guaranteed operating temperature, whereby the reliability of the entire module can be ensured (the service life can be extended). Chips close to each other in guaranteed operating temperature are stacked close to each other, whereby the reliability can be easily managed.

EXAMPLE 5

In this example, chips are stacked based on signal transmission/reception of the semiconductor integrated circuit chips S1 to S5.

When a plurality of chips are stacked, and is configured as a module, the lowered module function or malfunction may occur due to a signal delay or the like if no consideration is taken into signal transmission/reception based on an amount of signal transmission/reception or signal transmission/reception speed. Because of this, chips are stacked as in the following example 5A to 5C.

EXAMPLE 5A

In this example, specific chips having the closest relationship are disposed adjacent to each other. That is, as shown in FIG. 9, specific chips having the closest relationship are disposed adjacent to each other (S2 and S3 in the example of FIG. 9).

For example, chips with the largest amount of signal transmission/reception are disposed adjacent to each other. Specifically, a logic chip having a signal processing function and a memory chip (a cache chip such as DRAM or SRAM) that carries out data transmission to/receiving from the logic chip are stacked adjacent to each other. Conversely, a chip that does not carry out signal transmission/receiving, for example, a power control chip, is disposed at a distant position. When another chip is interposed between chips that carry out data transmission/receiving, the processing speed is slower due to a signal delay, and the capability of the entire system is degraded. Chips as described above are disposed adjacent to each other, thereby making it possible to improve the processing speed and to improve the capability of the entire system.

In addition, when a signal is transmitted to or received from each chip, chips whose operating frequencies are the closest to each other may be disposed adjacent to each other. By doing this, the timing deviation can be reduced to the minimum, and the capability of the entire system can be improved.

EXAMPLE 5B

In this example, a chip with the largest amount of signal transmission to/reception from a motherboard that is an interface substrate (for example, signal processing chip for processing a high speed signal) is disposed adjacent to the motherboard. That is, as shown in FIG. 10, the chip S1 with the largest amount of signal transmission to/reception from the motherboard (base substrate BS) are disposed adjacent to the motherboard. In this manner, in signal transmission to/reception from the motherboard, a signal delay can be reduced to the minimum, and the capability of the entire system can be improved.

EXAMPLE 5C

In this example, as shown in FIG. 11, for example, the chip S5 with more signal transmission/reception to and from an external environment is disposed at the most distant position from the motherboard (base substrate BS). For example, a chip for processing an external signal such as a CCD or CMOS sensor image signal, a voice signal, or an antenna signal is disposed at the top. By thus disposing the chip, when the CCD, antenna or the like is provided above the chip S5, a signal can be transmitted/received between the chip S5 and the external environment without being interrupted by the other chips S1 to S4.

EXAMPLE 6

In this example, chips are stacked based on an amount of generated electromagnetic waves of the semiconductor integrated circuit chips S1 to S5.

When a plurality of chips are stacked, and is configured as a module, an operating voltage is reduced with an increase in amount of signal transmission/reception between chips and with higher signal transmission/reception speed. Because of this, chips are easily affected by noise. That is, malfunction or voice/image distortion and the like may occur due to electromagnetic interference (EMI) caused by electromagnetic waves generated from each chip, power supply line, or grounding line. Because of this, chips are stacked as the following examples 6A and 6B.

EXAMPLE 6A

In this example, a chip with a large amount of generated electromagnetic waves is disposed at a position close to a motherboard. For example, as shown in FIG. 7B, the chip S1 with the largest amount of generated electromagnetic waves is disposed at the closest position to the base substrate BS. Conversely, a chip with the smallest amount of generated electromagnetic waves may be disposed at the most distant position from the base substrate.

For example, a chip with the largest amount of generated electromagnetic waves (for example, a chip with a large operating current on which a large current flows momentously, a sensor chip, a voice or image processing chip, a chip for processing an transmission/reception antenna signal or the like) is disposed at the closest position to the base substrate, and a chip easily affected by electromagnetic waves is disposed at the position distant from the motherboard. By thus disposing the chip, an effect of electromagnetic waves from the chip S1 on the other chips S2 to S5 can be restrained, and a malfunction caused by electromagnetic waves or the like can be prevented.

Apart from FIG. 7B, it is possible to stack chips in accordance with a variety of stacking methods as described in type 1 and type 2.

EXAMPLE 6B

In this example, a chip easily affected by electromagnetic waves is disposed at the most distant position from a motherboard (base substrate) in accordance with type 2, for example. In this way, the chip easily affected by electromagnetic waves (for example, a sensor chip, a voice or image processing chip, a chip for processing a transmission/reception antenna signal or the like) is disposed at a stack position distant from a power source substrate (base substrate) that is a source of generation of EMI or the like, whereby a malfunction caused by electromagnetic waves or the like can be prevented.

EXAMPLE 7

In this example, chips are stacked based on the chip size of the semiconductor integrated circuit chips S1 to S5.

The sizes of the stacked chips are not always identical to each other, and chips of various sizes often coexist and are stacked. In the case where various chip sizes coexist in this way, when the stacking order of chips is not proper, there occurs a problem such as a crack due to a stress, a connection failure, or increased manufacturing cost.

Three-dimensionally stacked modules generally have a high performance and a high density, the number of terminals for connecting the module to an external device increases. A connection called a flip chip having connection terminals disposed in a lattice shape is used for a package of such a module. In addition, a resin such as glass epoxy is often used for motherboard or package from the viewpoint of weight or price. A ratio of thermal expansion coefficient between such a resin and a semiconductor such as silicon or GsAs is about 5, and there occurs a stress due to a difference in thermal expansion coefficient between them. In a three-dimensional stack module, terminal pitches are drastically fined as compared with a two-dimensional module in which chips are arranged in a horizontal direction, thus making it difficult to make reliable connection between the motherboard and the chip.

From such a point of view, in this example, as shown in FIG. 7B, for example, the chip Si with the largest chip size is disposed at the closest position to the base substrate BS (motherboard). The chip size is determined in accordance with the following procedure.

EXAMPLE 7A

In this example, the chip size is judged based on a length of the long side of each chip (long side of the rectangle when a chip face vertical to a stack direction is defined as a rectangle or arbitrary side when the chip face is a square). Then, a chip with the longest long side is disposed at the closest position to the base substrate (motherboard).

EXAMPLE 7B

In this example, the chip size is judged based on a summation of a length of a long side (a long side of the rectangle when a chip face vertical to a stack direction is defined as a rectangle or an arbitrary side when the chip face is a square) and a length of a short side (a short side of the rectangle when a chip face vertical to a stack direction is defined as a rectangle or an arbitrary side when the chip face is a square). A chip with the largest summation of these lengths is disposed at the closest position to the base substrate.

EXAMPLE 7C

In this example, the chip size is judged based on an area for each chip (an area for a chip face vertical to a stack direction), and a chip with the largest area is disposed at the closest position to the base substrate.

In this way, in this example, chips are stacked in order from the largest chip size, whereby a connection failure due to a stress or the like is restrained, and the reliability of the entire module can be improved.

In this example 7 as well, chips can be stacked in accordance with a variety of stacking methods as described in type 1 and type 2.

EXAMPLE 8

In this example, chips are stacked based on the number of connection terminals or connection terminal pitch of the semiconductor integrated circuit chips S1 to S5.

The stacked chips are connected between mutual chips or between the chip and the motherboard (base substrate) by a connection terminal such as a through plug. However, the number of terminals or terminal pitch for the stacked chips is not always identical to each other, the chips with various terminal numbers or various terminal pitches often coexist and are stacked. In this way, in the case where various terminal numbers or terminal pitches coexist, when the stack order of chips is not proper, there occurs a problem such as crack due to a stress, a connection failure, an increased manufacturing cost. That is, there occurs a problem similar to that described in example 7. In addition, the number of terminals for signal transmitting/receiving to and from a motherboard is various depending on each chip. When a proper stack order is not selected, efficient disposition of chips or the improved performance of the entire module cannot be achieved. From such a point of view, in this example, chips are stacked as in the following examples 8A and 8B.

EXAMPLE 8A

In this example, as shown in FIG. 7B, for example, the chip S1 with the largest number of terminals is disposed at the closest position to the base substrate BS (motherboard). More specifically, the chip with the largest number of terminals connected to the motherboard is disposed at the closest position to the motherboard. By thus disposing the chip, it is possible to make efficient connection and improve performance of the entire module.

EXAMPLE 8B

In this example, as shown in FIG. 7B, for example, a chip with the largest terminal pitch is disposed at the closest position to the motherboard. From the viewpoint of the number of terminals, a chip with the smallest number of terminals is disposed at the closest position to the motherboard. By thus disposing the chip, it is possible to reduce a stress between the motherboard and the chip. Therefore, reliable connection can be made, and the reliability of the entire module can be improved.

In this example 8 as well, chips can be stacked in accordance with a variety of stacking methods as described in type 1 and type 2.

EXAMPLE 9

In this example, chips are stacked based on chip thickness of the semiconductor integrated circuit chips S1 to S5.

The thickness of stacked chips is not always identical, and chips with various thickness often coexist and are stacked. In this way, in the case where various chip thickness coexist, when the stack order of chips is not proper, there occurs a problem such as a crack due to a stress or a connection failure. In the three-dimensionally stacked module, it is desirable that the thickness of each chip be as thin as possible in order to ensure high performance and high density. However, when the chip thickness is too thin, the chip strength becomes weakened. Thus, there is a problem that the reliability of the entire module is degraded. From such a point of view, in this example, chips are stacked as in the following examples 9A and 9B.

EXAMPLE 9A

In this example, as shown in FIG. 7B, for example, the chip S1 with the largest chip thickness is disposed at the closest position to the base substrate BS (motherboard).

An absolute value of a yield stress (strength) against a load such as bending or stress is proportional to thickness, and in general, the thicker chip has a larger strength. In the three-dimensionally stacked module, a stress between the chip in the bottom and the motherboard is the largest due to a difference in thermal expansion coefficient that has been already described. Therefore, the thickest chip is disposed at the motherboard side, whereby the strength of the entire module can be improved, and a reliable three-dimensional module can be obtained.

EXAMPLE 9B

In this example, as shown in FIG. 7A, for example, a chip with the smallest chip thickness is disposed at the closest position to the base substrate (motherboard).

As has been described previously, an absolute value of a yield stress (strength) is proportional to thickness. However, a thinner chip is superior in displacement by a stress, that is, in flexibility. A flexible chip, i.e., a thinner chip is hardly broken due to flexibility having the chip itself, even when a stress is generated between the chip and the motherboard. Because of this, the strength of the entire module can be improved, and a reliable three-dimensional module can be obtained.

In this example 9 as well, it is possible to stack chips in accordance with a variety of stacking methods as described in type 1 and type 2.

EXAMPLE 10

In this example, chips are disposed in consideration of a position relationship among the semiconductor integrated circuit device chips.

As has been described previously, the sizes of stacked chips are not always identical to each other, and chips of various sizes often coexist and are stacked each other. In this way, in the case where various chip sizes exist, when a method of stacking chips is not proper, efficient disposition cannot be carried out.

Figure 12:
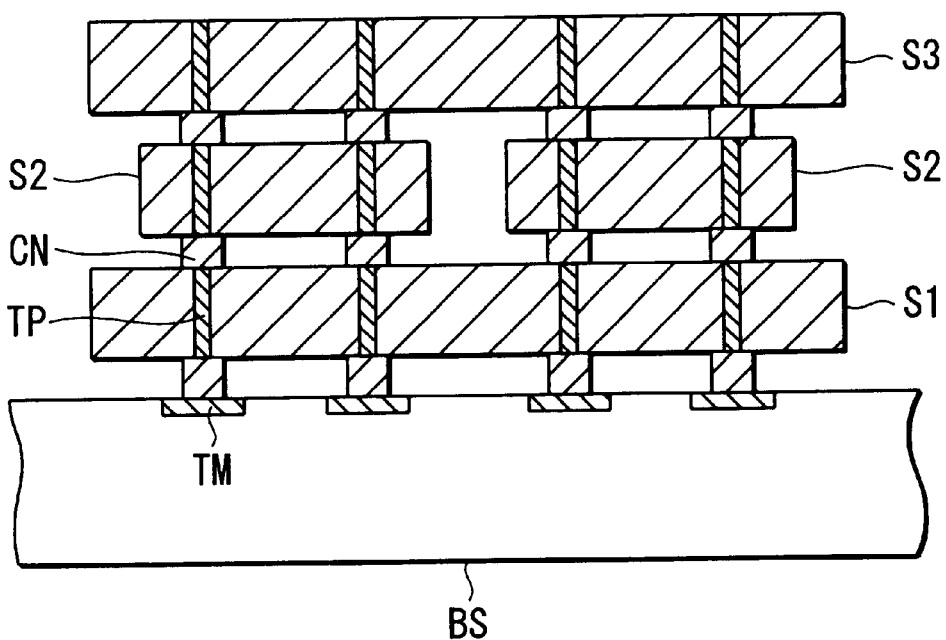
FIG. 12 is a view schematically showing a sectional configuration of another example of the stacked type semiconductor device according to one embodiment of the present invention.

In this example, a plurality of chips of small sizes are sandwiched between chips of large sizes. FIG. 12 is a view showing an example of this configuration. Reference numerals are identical to those shown in FIG. 1A. As shown in FIG. 12, chips of large sizes are disposed at positions of the chip S1 and the chip S3, and a plurality of chips S2 of small sizes are disposed in a horizontal direction (identical plane) at a position between the chip S1 and the chip S3. By thus disposing chips, the chips can be disposed with high density, and a high performance module can be obtained.

If a plurality of chips of small sizes are provided in the uppermost layer, the module is easily bent into a U-shape by the stress. In the present example, since the chips of small sizes are sandwiched by the chips of large sizes, the module is hardly bent, and the above problem can be reduced. In the uppermost layer in which the plurality of chips of small sizes are provided, the number of total terminals of the chips increases. Hence, to connect these chips to the large chips provided in the lowermost layer, many through plugs must be provided in an intermediate chip arrange between the upper most layer and the lowermost layer. In the present example, so many through plugs need not be used, and the above problem can be reduced.

Additional advantages and modifications will readily occur to those skilled in the art. Therefore, the invention in its broader aspects is not limited to the specific details and representative embodiments shown and described herein.

Accordingly, various modifications may be made without departing from the spirit or scope of the general inventive concept as defined by the appended claims and their equivalents.

What is claimed is:

1. A stacked type semiconductor device formed of a plurality of semiconductor integrated circuit devices stacked, each having a parameter and including a semiconductor integrated circuit chip, wherein at least three of the semiconductor integrated circuit devices, at least two of which differ in a numerical value of the parameter, are stacked in the order of a numerical value of the parameter, wherein the parameter is selected from a group of power consumption, operating voltage, number of operating voltages, operating current, guaranteed operating temperature, amount of generated electromagnetic waves, operating frequency, number of connection terminals, connection terminal pitch, thickness, amount of signals transmitted to and from a base substrate on which the semiconductor integrated circuit devices are to be mounted, and amount of signals transmitted to and from an external environment.

2. A stacked type semiconductor device according to claim 1, wherein each of the semiconductor integrated circuit devices further includes a substrate on which the semiconductor integrated circuit chip is mounted.

3. A stacked type semiconductor device according to claim 1, wherein each of the semiconductor integrated circuit chips has the parameter.

4. A stacked type semiconductor device according to claim 1, wherein said at least three of the semiconductor integrated circuit devices are sequentially stacked.

5. A stacked type semiconductor device according to claim 1, further comprising:

a fourth semiconductor integrated circuit device arranged between one and two others of said at least three semiconductor integrated circuit devices.

6. A stacked type semiconductor device according to claim 1, wherein said at least three of the semiconductor integrated circuit devices include at least one of an uppermost one and a lowermost one of the semiconductor integrated circuit devices.

7. A stacked type semiconductor device according to claim 1, wherein each of the semiconductor integrated circuit devices includes a conductor that penetrates the semiconductor integrated circuit device, and the semiconductor integrated circuit devices are electrically connected by the conductors.

8. A stacked type semiconductor device formed of at least three semiconductor integrated circuit devices stacked, each having a parameter and including a semiconductor integrated circuit chip, wherein at least two of the semiconductor integrated circuit devices differ in a numerical value of the parameter, and a numerical value of the parameter of the uppermost semiconductor integrated circuit device or the lowermost semiconductor integrated circuit device is maximum or minimum, wherein the parameter is selected from a group of power consumption, operating voltage, number of operating voltages, operating current, guaranteed operating temperature, amount of generated electromagnetic waves, operating frequency, number of connection terminals, connection terminal pitch, thickness, amount of signals transmitted to and from a base substrate on which the semiconductor integrated circuit devices are to be mounted, and amount of signals transmitted to and from an external environment.

9. A stacked type semiconductor device according to claim 8, wherein each of the semiconductor integrated circuit devices further includes a substrate on which the semiconductor integrated circuit chip is mounted.

10. A stacked type semiconductor device according to claim 8, wherein each of the semiconductor integrated circuit chips has the parameter.

11. A stacked type semiconductor device according to claim 8, wherein each of the semiconductor integrated circuit devices includes a conductor that penetrates the semiconductor integrated circuit device, and the semiconductor integrated circuit devices are electrically connected by the conductors.

12. A stacked type semiconductor device formed of at least two semiconductor integrated circuit devices stacked, each having a parameter and including a semiconductor integrated circuit chip, wherein each of the semiconductor integrated circuit devices includes a conductor that penetrates the semiconductor integrated circuit device, the semiconductor integrated circuit devices are electrically connected by the conductors, at least two of the semiconductor integrated circuit devices differ in a numerical value of the parameter, and a numerical value of the parameter of the uppermost semiconductor integrated circuit device or the lowermost semiconductor integrated circuit device is maximum or minimum, wherein the parameter is selected from a group of power consumption, operating voltage, number of operating voltages, operating current, guaranteed operating temperature, amount of generated electromagnetic waves, operating frequency, number of connection terminals, connection terminal pitch, thickness, amount of signals transmitted to and from a base substrate on which the semiconductor integrated circuit devices are to be mounted, and amount of signals transmitted to and from an external environment.

13. A stacked type semiconductor device according to claim 12, wherein each of the semiconductor integrated circuit devices further includes a substrate on which the semiconductor integrated circuit chip is mounted.

14. A stacked type semiconductor device according to claim 12, wherein each of the semiconductor integrated circuit chips has the parameter.

15. A stacked type semiconductor device according to claim 12, wherein the conductor penetrates the semiconductor integrated circuit chip or a substrate on which the semiconductor integrated circuit chip is mounted.

16. A stacked type semiconductor device formed of a plurality of semiconductor integrated circuit devices stacked, each having a parameter and including a semiconductor integrated circuit chip, wherein at least two of the semiconductor integrated circuit devices differ in a numerical value of the parameter, and at least two, but not all, of the semiconductor integrated circuit devices form a group, have numerical values of the parameter which fall within a predetermined range and are sequentially stacked, wherein the parameter is selected from a group of power consumption, operating voltage, number of operating voltages, operating current, guaranteed operating temperature, amount of generated electromagnetic waves, operating frequency, number of connection terminals, connection terminal pitch, thickness, amount of signals transmitted to and from a base substrate on which the semiconductor integrated circuit devices are to be mounted, and amount of signals transmitted to and from an external environment.

17. A stacked type semiconductor device according to claim 16, wherein each of the semiconductor integrated circuit devices further includes a substrate on which the semiconductor integrated circuit chip is mounted.

18. A stacked type semiconductor device according to claim 16, wherein each of the semiconductor integrated circuit chips has the parameter.

19. A stacked type semiconductor device according to claim 16, wherein sequentially stacked semiconductor integrated circuit devices other than said at least two of the semiconductor integrated circuit devices forming the group, form an additional group, and the semiconductor integrated circuit devices forming said additional group have numerical values of the parameter which fall within a range other than said predetermined range.

20. A stacked type semiconductor device according to claim 16, wherein two of the semiconductor integrated circuit devices, between which a difference of the numerical values of the parameter is smallest, are included in the group.

21. A stacked type semiconductor device according to claim 16, wherein each of the semiconductor integrated circuit devices includes a conductor that penetrates the semiconductor integrated circuit device, and the semiconductor integrated circuit devices are electrically connected by the conductors.

22. A stacked type semiconductor device formed of a plurality of semiconductor integrated circuit devices stacked, each including a semiconductor integrated circuit chip, wherein two of the semiconductor integrated circuit devices, between which a largest amount of signals is transmitted, are sequentially stacked.

23. A stacked type semiconductor device comprising:
a first semiconductor integrated circuit device including a semiconductor integrated circuit chip;
a second semiconductor integrated circuit device including a semiconductor integrated circuit chip and spaced apart from the first semiconductor integrated circuit device in a first direction; and
a plurality of semiconductor integrated circuit devices arranged in a plane perpendicular to the first direction and sandwiched by the first and second semiconductor integrated circuit devices, each of the semiconductor integrated circuit devices including a semiconductor integrated circuit chip.

24. A stacked type semiconductor device formed of a plurality of semiconductor integrated circuit devices stacked, each having a parameter and including a semiconductor integrated circuit chip, wherein at least one of the semiconductor integrated circuit devices is stacked out of the order of a numerical value of the parameter, and at least two, but not all, of the semiconductor integrated circuit devices form a group, have numerical values of the parameter which fall within a predetermined range and are sequentially stacked, wherein the parameter is selected from a group of power consumption, operating voltage, number of operating voltages, operating current, guaranteed operating temperature, amount of generated electromagnetic waves, operating frequency, size, number of connection terminals, connection terminal pitch, thickness, amount of signals transmitted to and from a base substrate on which the semiconductor integrated circuit devices are to be mounted, and amount of signals transmitted to and from an external environment.

25. A stacked type semiconductor device comprising at least four semiconductor integrated circuit devices stacked, each having a parameter and including a semiconductor integrated circuit chip, wherein a numerical value of the parameter of a predetermined one, other than an uppermost one and a lowermost one, of the semiconductor integrated circuit devices is maximum, and at least three, including said predetermined one, of the semiconductor integrated circuit devices differ in a numerical value of the parameter and are stacked in the order of a numerical value of the parameter, wherein the parameter is selected from a group of power consumption, operating voltage, number of operating voltages, operating current, guaranteed operating temperature, amount of generated electromagnetic waves, operating frequency, size, number of connection terminals, connection terminal pitch, thickness, amount of signals transmitted to and from a base substrate on which the semiconductor integrated circuit devices are to be mounted, and amount of signals transmitted to and from an external environment.

26. A stacked type semiconductor device comprising at least three semiconductor integrated circuit devices stacked, each having a parameter and including a semiconductor integrated circuit chip, wherein a numerical value of the parameter of a predetermined one, other than an uppermost one and a lowermost one, of the semiconductor integrated circuit devices is minimum, and at least two, including said predetermined one, of the semiconductor integrated circuit devices differ in a numerical value of the parameter and are stacked in the order of a numerical value of the parameter, wherein the parameter is selected from a group of power consumption, operating voltage, number of operating voltages, operating current, guaranteed operating temperature, amount of generated electromagnetic waves, operating frequency, size, number of connection terminals, connection terminal pitch, thickness, amount of signals transmitted to and from a base substrate on which the semiconductor integrated circuit devices are to be mounted, and amount of signals transmitted to and from an external environment.

* * * * *